(12) United States Patent
Favale, Jr. et al.

(10) Patent No.: US 12,727,304 B2
(45) Date of Patent: Sep. 1, 2026

(54) LIGHT COLLECTOR FOR LIGHT MIXING IN LIGHT EMITTING DIODE PACKAGES

(71) Applicant: CreeLED, Inc., Durham, NC (US)

(72) Inventors: Joseph M. Favale, Jr., Cary, NC (US); Christopher P. Hussell, Raleigh, NC (US); Robert David Schmidt, Wake Forest, NC (US)

(73) Assignee: CreeLED, Inc., Durham, NC (US)

( * ) Notice: Subject to any disclaimer, the term of this patent is extended or adjusted under 35 U.S.C. 154(b) by 344 days.

(21) Appl. No.: 18/207,399

(22) Filed: Jun. 8, 2023

(65) Prior Publication Data

US 2024/0413281 A1 Dec. 12, 2024

(51) Int. Cl.
*H10H 20/856* (2025.01)
*H10W 90/00* (2026.01)

(52) U.S. Cl.
CPC .......... *H10H 20/856* (2025.01); *H10W 90/00* (2026.01)

(58) Field of Classification Search
CPC .......................... H10H 20/856; H01L 25/0753
See application file for complete search history.

(56) References Cited

U.S. PATENT DOCUMENTS

| | | | |
|---|---|---|---|
| 7,928,456 | B2 | 4/2011 | Andrews et al. |
| 8,044,418 | B2 | 10/2011 | Loh et al. |
| 8,368,112 | B2 | 2/2013 | Chan et al. |
| 9,240,530 | B2 | 1/2016 | Raiherzer |
| 10,211,380 | B2 | 2/2019 | Lin et al. |
| 10,410,997 | B2 | 9/2019 | Gould et al. |
| 10,490,712 | B2 | 11/2019 | Lin et al. |
| 11,094,852 | B2 | 8/2021 | Pang et al. |

(Continued)

FOREIGN PATENT DOCUMENTS

| | | | | |
|---|---|---|---|---|
| CN | 101110462 | A | | 1/2008 |
| JP | 2002-368283 | A | * | 6/2001 |

(Continued)

OTHER PUBLICATIONS

Author Unknown, "Specifications for Nichia Chip Type Warm White LED," Model NS6L083AT, No. STSE-CC7136A, Sep. 2008, Nichia Corporation, 14 pages.

(Continued)

*Primary Examiner* — Mohammad A Rahman
(74) *Attorney, Agent, or Firm* — Withrow & Terranova, P.L.L.C.

(57) ABSTRACT

Light-emitting diode (LED) packages, and more particularly to a light collector for light mixing in LED packages to improve the far field emission pattern (FFP) of the LED packages are disclosed. The LED package can include one or more LED chips with different wavelength ranges, and the light collector placed over the LED chips can have a reflective surface, save for a reduced aperture through which the light form the LED chips can be emitted after mixing in the light collector. The LED package can also include a lens to further improve the FFP. In an embodiment the light collector can include diffuser material to facilitate the mixing of the light within the light collector. The LED package with the light collector mixes multiple emission point sources into a single point source, or reduced-area source, that considerably improves the FFP of multi-colored LED chips of the LED package.

26 Claims, 13 Drawing Sheets

(56) References Cited

U.S. PATENT DOCUMENTS

| | | | | |
|---|---|---|---|---|
| 11,430,769 | B2 | 8/2022 | Gould et al. | |
| 2003/0025117 | A1 | 2/2003 | Isokawa et al. | |
| 2003/0071568 | A1 | 4/2003 | Lowery et al. | |
| 2004/0079942 | A1 | 4/2004 | Steranka et al. | |
| 2006/0102918 | A1 | 5/2006 | Su et al. | |
| 2007/0018175 | A1* | 1/2007 | Mazzochette | H10H 20/856 257/E33.059 |
| 2009/0242919 | A1 | 10/2009 | Lin et al. | |
| 2013/0307003 | A1 | 11/2013 | Park et al. | |
| 2014/0191278 | A1 | 7/2014 | Nishijima et al. | |
| 2015/0311411 | A1 | 10/2015 | Yagi et al. | |
| 2018/0323352 | A1 | 11/2018 | Takano et al. | |
| 2019/0326486 | A1 | 10/2019 | Ting et al. | |
| 2020/0098957 | A1 | 3/2020 | Pang et al. | |
| 2020/0135991 | A1 | 4/2020 | Lin et al. | |
| 2020/0251635 | A1 | 8/2020 | Li | |
| 2021/0213147 | A1 | 7/2021 | Donhowe et al. | |
| 2022/0310567 | A1 | 9/2022 | Pang et al. | |
| 2023/0282786 | A1 | 9/2023 | Favale, Jr. et al. | |
| 2024/0145652 | A1 | 5/2024 | Hussell et al. | |

FOREIGN PATENT DOCUMENTS

| | | | |
|---|---|---|---|
| JP | 2011-071446 | A * | 9/2009 |
| JP | 4754723 | B2 | 8/2011 |
| KR | 20120020600 | A | 3/2012 |
| KR | 20150049533 | A | 5/2015 |
| KR | 20210004548 | A | 1/2021 |
| TW | 200940875 | A | 10/2009 |
| TW | 201034050 | A | 9/2010 |
| TW | 201113940 | A | 4/2011 |

OTHER PUBLICATIONS

Author Unknown, “Specifications for Nichia Chip Type White LED,” Model NS6W083AT, No. STSE-CC7134A, 2007, Nichia Corporation, 14 pages.

Invitation to Pay Additional Fees and Partial Search for International Patent Application No. PCT/US2024/032426, mailed Sep. 5, 2024, 24 pages.

International Search Report and Written Opinion for International Patent Application No. PCT/US2024/032426, mailed Oct. 29, 2024, 29 pages.

International Search Report and Written Opinion for International Patent Application No. PCT/US2024/038957, mailed Nov. 19, 2024, 9 pages.

Office Action for Canadian Patent Application No. 3292897, mailed Apr. 29, 2026, 4 pages.

* cited by examiner

LIGHT COLLECTOR FOR LIGHT MIXING IN LIGHT EMITTING DIODE PACKAGES

FIELD OF THE DISCLOSURE

The present disclosure relates to light-emitting diode (LED) packages, and more particularly to a light collector for light mixing in LED packages.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from gallium nitride, gallium phosphide, aluminum nitride, indium nitride, gallium-indium-based materials, gallium arsenide-based materials, and/or from organic semiconductor materials. Photons generated by the active region are initiated in all directions.

LED packages have been developed that can provide mechanical support, electrical connections, and encapsulation for LED emitters. Lumiphoric materials, such as phosphors, may also be arranged in close proximity to LED emitters to convert portions of light emissions to different wavelengths. As LED technology continues to be developed for ever-evolving modern applications, challenges exist in keeping up with operating demands for LED packages and related elements of LED packages.

LED packages that contain more than one LED chip, particularly LED packages with different colored LED chips can have far field patterns (FFPs) that have different color intensities depending on the angle at which the LED package is viewed. This is detrimental to the color uniformity of LED displays and other applications as the color is observed to change with viewing angle.

The art continues to seek improved LEDs and solid-state lighting devices having desirable illumination characteristics capable of overcoming challenges associated with conventional lighting devices.

SUMMARY

The present disclosure relates to light-emitting diode (LED) packages, and more particularly to a light collector for light mixing in LED packages to improve the far field pattern (FFP) of the LED packages. The LED package can be comprised of one or more LED chips with different wavelength ranges, and the light collector placed over the LED chips can have a reflective surface, save for a reduced aperture through which the light form the LED chips can be emitted after mixing in the light collector. The LED package can also include a lens to further modify the FFP. In an embodiment the light collector can include diffuser material to facilitate the mixing of the light within the light collector. The LED package with the light collector mixes multiple emission point sources into a single point source, or reduced-area source, that considerably improves the FFP of multi-colored LED chips of the LED package.

In an embodiment, an LED package can include one or more LED chips, at least one light collector arranged over the one or more LED chips, wherein the light collector is formed from a first light-transmissive material, and at least one reflective coating on a surface of the light collector wherein the reflective coating forms at least one aperture.

In an embodiment, the aperture of the light collector is at a top of a stem portion of the light collector.

In an embodiment, a first width of the stem portion and the aperture is less than 10% of a second width of a housing.

In an embodiment, a width of the aperture is at least 50 μm.

In an embodiment, a height of the stem portion is such that at least a portion of light emitted by at least one LED chip of the one or more LED chips reflects off at least one surface at least one time before exiting the aperture.

In an embodiment, there is not a direct line of sight between the aperture and a significant portion of at least one LED chip of the one or more LED chips.

In an embodiment, a lens with a curved surface is fixed at least partially over the light collector.

In an embodiment, the LED package further includes a fill layer surrounding the light collector that blocks stray light from the light collector.

In an embodiment, the LED package further includes a masking layer on the fill layer.

In an embodiment, the light collector comprises diffuser material that diffuses light emitted by the one or more LED chips.

In an embodiment, a top surface of the light collector is at least one of curved or straight, and wherein the stem portion is at an apex of the light collector.

In an embodiment, the reflective coating comprises at least one of a metal or metal oxide.

In an embodiment, respective far field patterns of light emitted by each LED chip of a plurality of chips have a maximum delta-theta of less than 2 degrees.

In an embodiment, the first light-transmissive material is epoxy or silicone.

In an embodiment, the LED package can further include a housing that forms a recess with a recess floor and one or more recess sidewalls, wherein the one or more LED chips are arranged in the recess and a lead frame structure extending through the housing, wherein a portion of the lead frame structure is arranged along the recess floor.

In another embodiment, an LED package can include one or more LED chips, and at least one light collector arranged at least partially over the one or more LED chips, wherein the light collector comprises a columnar protrusion and wherein the light collector is formed from a first light-transmissive material.

In an embodiment, a first width of the columnar protrusion is within 25% and 250% of a lateral dimension of one LED chip of the one or more LED chips.

In an embodiment, there is not a direct line of sight between at least 50% of the top surface of one LED chip of the one or more LED chips and an aperture of the light collector.

In an embodiment, the light collector comprises diffuser material that diffuses light emitted by the one or more LED chips.

In an embodiment, respective far field patterns of light emitted by each LED chip of a plurality of chips have a maximum delta-theta of less than 2 degrees.

In an embodiment, the LED package further includes a housing that forms a recess with a recess floor and one or more recess sidewalls and a lead frame structure extending through the housing, wherein a portion of the lead frame structure is arranged along the recess floor.

In an embodiment, the LED package further includes a reflective coating covering an entire outer surface of the light collector except for a reduced aperture at a top of the columnar protrusion.

In an embodiment, the LED package further includes a lens at least partially over the light collector.

In another embodiment, an LED package includes a housing that forms a recess with a recess floor and one or more recess sidewalls and a lead frame structure extending through the housing, wherein a portion of the lead frame structure is arranged along the recess floor. The LED package can also include one or more LED chips arranged within the recess and electrically coupled with the lead frame structure, a light collector arranged at least partially within the recess and over the one or more LED chips, wherein the light collector is formed from a first light-transmissive material, a reflective coating on a surface of the light collector wherein the reflective coating forms an aperture at an apex of the light collector, and a lens with a curved surface is fixed over at least part of the light collector.

In another embodiment, an LED display can include a display panel and at least one LED package comprising a one or more LED chips, at least one light collector arranged over the one or more LED chips, wherein the light collector is formed from a first light-transmissive material, and at least one reflective coating on a surface of the light collector wherein the reflective coating forms at least one aperture.

In an embodiment, a lens with a curved surface is fixed over at least part of the light collector.

In an embodiment, respective far field patterns of light emitted by each LED chip of a plurality of chips have a maximum delta-theta of less than 2 degrees.

In an embodiment, the one or more LED chips is a plurality of LED chips that are comprised of a combination of red, green, and blue LED chips.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
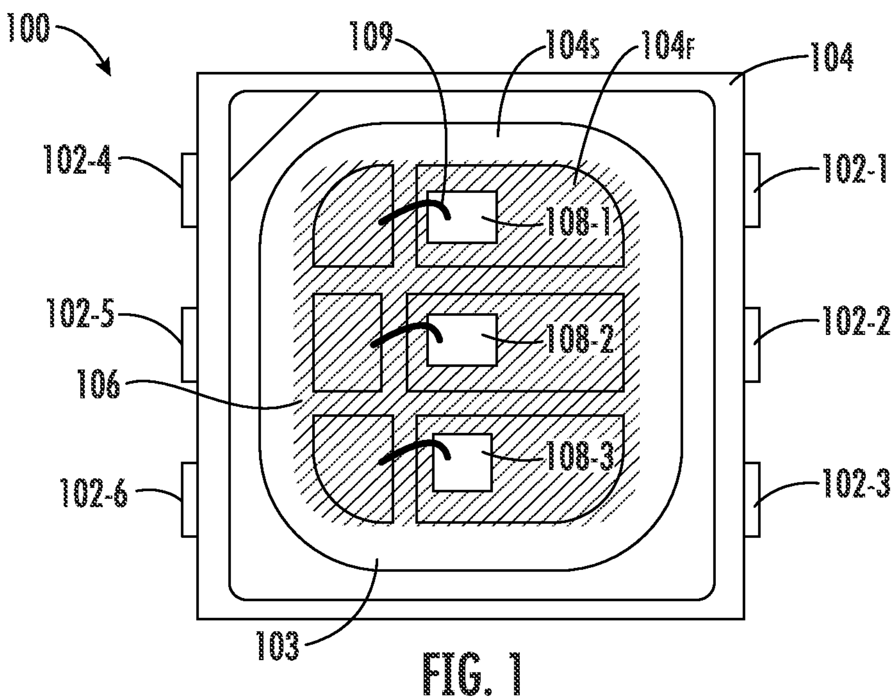
FIG. 1 is a top view of a light-emitting diode (LED) package that includes a lead frame structure collectively formed by a plurality of leads, a body or housing that encases a portion of the lead frame structure, and a first encapsulation layer that is arranged within a recess that is formed by the housing according to an embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to light-emitting diode (LED) packages, and more particularly to a light collector for light mixing in LED packages to improve the far field emission pattern (FFP) of the LED packages. The LED package can be comprised of one or more LED chips with different wavelength ranges, and the light collector placed over the LED chips can have a reflective surface, save for a reduced aperture through which the light form the LED chips can be emitted after mixing in the light collector. The LED package can also include a lens to further modify the FFP. In an embodiment the light collector can include diffuser material to facilitate the mixing of the light within the light collector. The LED package with the light collector mixes multiple emission point sources into a single point source, or a reduced-area source, that considerably improves the FFP of multi-colored LED chips of the LED package.

Before delving into specific details of various aspects of the present disclosure, an overview of various elements that may be included in exemplary LED packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include organic semiconductor materials, and other Group III-V systems such as gallium phosphide (GaP), gallium arsenide (GaAs), and related compounds.

The active LED structure may be grown on a growth substrate that can include many materials, such as sapphire, SiC, silicon, aluminum nitride (AlN), and GaN. Sapphire is another common substrate for Group III nitrides and also has certain advantages, including being lower cost, having established manufacturing processes, and having good light-transmissive optical properties, among other related substrates.

Different embodiments of the active LED structure can emit different wavelengths of light depending on the composition of the active layer. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 700 nm. In certain embodiments, the active LED structure may be configured to emit light that is outside the visible spectrum, including one or more portions of the ultraviolet (UV) spectrum, or one or more portions of the near infrared spectrum, and/or the infrared spectrum (e.g., 700 nm to 1000 nm). The UV spectrum is typically divided into three wavelength range categories denotated with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications.

An LED chip can also be covered with one or more lumiphoric materials (also referred to herein as lumiphores), such as phosphors, such that at least some of the light from the LED chip is absorbed by the one or more lumiphores and is converted to one or more different wavelength spectra according to the characteristic emission from the one or more lumiphores. In this regard, at least one lumiphore receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of 2500 Kelvin (K) to 10,000 K. In certain embodiments, lumiphoric materials having cyan, green, amber, yellow, orange, and/or red peak emission wavelengths may be used. In some embodiments, the combination of the LED chip and the one or more lumiphores (e.g., phosphors) emits a generally white combination of light. The one or more phosphors may include yellow (e.g., YAG:Ce), green (e.g., LuAg:Ce), and red (e.g., $Ca_{i-x-y}Sr_{x}Eu_{y}AlSiN_{3}$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, lumiphoric materials may be provided over one or more surfaces of LED chips, while other surfaces of such LED chips may be devoid of lumiphoric material.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In certain embodiments, a lateral geometry LED chip may be mounted on a submount of an LED package such that the anode and cathode connections are on a face of the LED chip that is opposite the submount. In this configuration, wire bonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In other embodiments, an active LED structure may be bonded to a carrier submount, and the growth substrate may be removed such that light may exit the active LED structure without passing through the growth substrate.

According to aspects of the present disclosure, LED packages may include one or more elements, such as lumiphoric materials, encapsulants, light-altering materials, lenses, and electrical contacts, among others that are provided with one or more LED chips. In certain aspects, an LED package may include a support member, such as a submount or a lead frame. Suitable materials for the submount include, but are not limited to, ceramic materials such as aluminum oxide or alumina, AlN, or organic insulators like polyimide (PI) and polyphthalamide (PPA). In other embodiments, a submount may comprise a printed circuit board (PCB), sapphire, Si or any other suitable material. For PCB embodiments, different PCB types can be used such as standard FR-4 PCB, metal core PCB, or any other type of PCB. In still further embodiments, the support structure may embody a lead frame structure. Light-altering materials may be arranged within LED packages to reflect or otherwise redirect light from the one or more LED chips in a desired emission direction or pattern.

In certain embodiments, aspects of the present disclosure relate LED packages with lead frame structures that are at least partially encased by a body or housing. A lead frame structure may typically be formed of a metal, such as copper, copper alloys, or other conductive metals. The lead frame structure may initially be part of a larger metal structure that is singulated during manufacturing of individual LED packages. Within an individual LED package, isolated portions of the lead frame structure may form anode and cathode connections for an LED chip. The body or housing may be formed of an insulating material that is arranged to surround or encase portions of the lead frame structure. The body may be formed on the lead frame structure before singulation so that the individual lead frame portions may be electrically isolated from one another and mechanically supported by the body within an individual LED package. The body may form a cup or a recess in which one or more LED chips may be mounted to the lead frame at a floor of the recess. Portions of the lead frame structure may extend from the recess and through the body to protrude or be accessible outside of the body to provide external electrical connections. An encapsulant material, such as silicone or epoxy, may fill the recess to encapsulate the one or more LED chips.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, or otherwise redirect light. For light-reflective materials, the light-altering material may include at least one of fused silica, fumed silica, titanium dioxide ($TiO_2$), or metal particles suspended in a binder, such as silicone or epoxy. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast.

In certain embodiments, the light-altering material includes both light-reflective material and light-absorbing material suspended in a binder. A weight ratio of the light-reflective material to the binder may comprise a range of about 1:1 to about 2:1. A weight ratio of the light-absorbing material to the binder may comprise a range of about 1:400 to about 1:10. In certain embodiments, a total weight of the light-altering material includes any combination of the binder, the light-reflective material, and the light-absorbing material. In some embodiments, the binder may comprise a weight percent that is in a range of about 10% to about 90% of the total weight of the light-altering material. The light-reflective material may comprise a weight percent that is in a range of about 10% to about 90% of the total weight of the light-altering material. The light-absorbing material may comprise a weight percent that is in a range of about 0% to about 15% of the total weight of the light-altering material.

In further embodiments, the light-absorbing material may comprise a weight percent that is in a range of about greater than 0% to about 15% of the total weight of the light-altering material. In further embodiments, the binder may comprise a weight percent that is in a range of about 25% to about 70% of the total weight of the light-altering material. The light-reflective material may comprise a weight percent that is in a range of about 25% to about 70% of the total weight of the light-altering material. The light-absorbing material may comprise a weight percent that is in a range of about 0% to about 5% of the total weight of the light-altering material. In further embodiments, the light-absorbing material may comprise a weight percent that is in a range of about greater than 0% to about 5% of the total weight of the light-altering material.

FIG. 1 is a top view of an LED package 100 that includes a lead frame structure collectively formed by a plurality of leads 102-1 to 102-6, a body or housing 104 that encases a portion of the lead frame structure, and an encapsulation layer 106 that is arranged within a recess 103 that is formed by the housing 104. The encapsulation layer 106 can surround and at least partially cover one or more of the LED chips 108-1 to 108-3.

Figure 2:
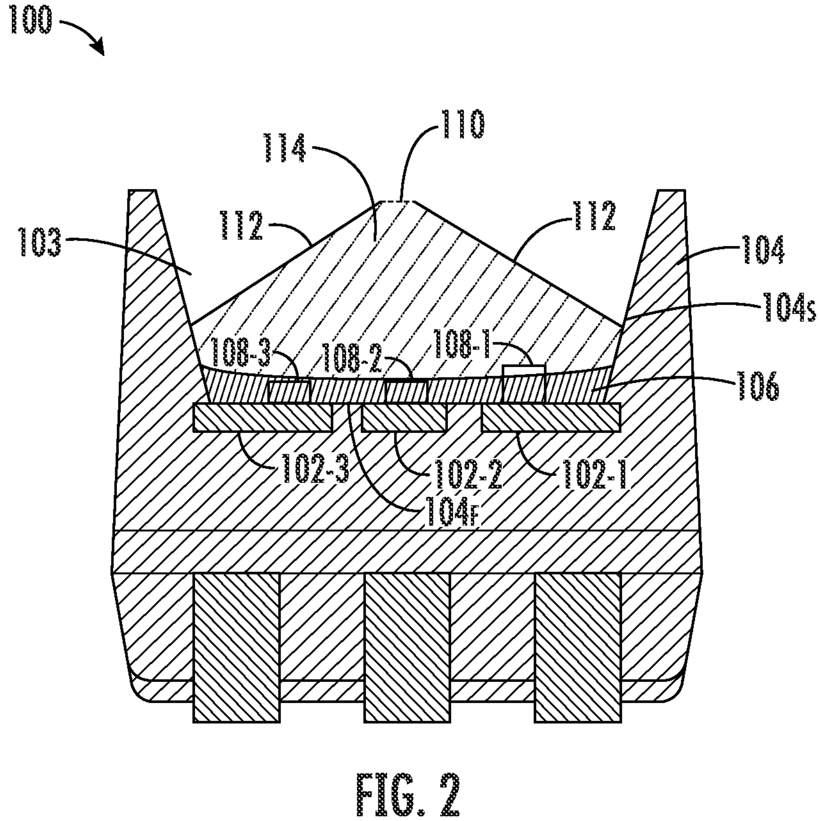
FIG. 2 is a cross-sectional view of the LED package of FIG. 1 according to an embodiment of the present disclosure.

FIG. 2 is a cross-sectional view of the LED package 100 of FIG. 1. The LED package 100 includes LED chips 108-1 to 108-3 that are mounted on and electrically respectively coupled to the leads 102-1 to 102-3 and electrically coupled to corresponding leads 102-4 to 102-6 by way of wire bonds 109. While a single wire bond 109 is illustrated in FIG. 1 for each LED chip 108-1 to 108-3, it is understood that various ones of the LED chip 108-1 to 108-3 may embody a lateral structure where a second wire bond may be employed to provide electrical coupling.

In certain aspects, each of the LED chips 108-1 to 108-3 may be configured to emit a different wavelength from the other LED chips. For example, the LED chip 108-1 may be configured to emit red light, the LED chip 108-2 may be configured to emit green light, and the LED chip 108-3 may be configured to emit blue light. In certain embodiments, differences between red, green, and blue emissions may necessitate the LED chip 108-1 being formed of a different material system than the other LED chips 108-2, 108-3. In still further embodiments, the differences between the LED chips 108-1 to 108-3 may include different chip geometries, such as the LED chip 108-1 having a greater thickness than the LED chips 108-2, 108-3. While three LED chips 108-1 to 108-3 are illustrated, the principles disclosed herein are applicable to any number of LED chips within the LED package 100. The recess 103 may include a recess floor 104$_F$ and one or more recess sidewalls 104$_S$. The leads 102-1 to 102-6 may be arranged to extend through the housing 104 and a portion of the leads 102-1 to 102-6 may be arranged along or otherwise exposed at the recess floor 104$_F$.

It is to be appreciated that while FIG. 1 depicts the LED chips 108-1 to 108-3 being arranged in a line, in other embodiments, the LED chips 108-1 to 108-3 can be arranged in different configurations such as for example, each chip being arranged equally around a center location of the recess floor 104$_F$. In other embodiments, the arrangement can be based on the color being emitted by the LED chips. For example, an LED chip that emits red light can be placed in the center of the LED package. Since the center chip is likely to have a higher light output efficiency due to the geometry of the LED package 100, and since comparable red LED chips can be more expensive than their green or blue counterparts at comparable absolute intensities, a smaller red LED chip can be used, thereby saving cost.

As best illustrated in FIG. 2, the encapsulation layer 106 may be arranged on portions of the one or more recess sidewalls 104$_S$, along the recess floor 104$_F$, and covering portions of the leads 102-1 to 102-6 that are arranged along the recess floor 104$_F$. Depending on various geometries of the LED chips 108-1 to 108-3, the encapsulation layer 106 may cover one or more sidewalls of the LED chips 108-1 to 108-3, as well as some top surfaces of the LED chips 108-1 to 108-3. For example, one or more portions of the LED chip 108-1 may extend above the top surfaces of the encapsulation layer 106. The encapsulation layer 106 may include an epoxy or silicone, depending on the application. In further embodiments, encapsulation layer 106 may be configured to be light-transmissive and/or light-transparent to wavelengths of light generated by the LED chips 108-1 to 108-3. In the example where the LED chip 108-1 extends above the first encapsulation layer 106-1, one or more portions of the LED chip 108-1, such as a top surface of the LED chip 108-1 may extend into or otherwise reside within a light collector 114.

It is to be appreciated that while FIG. 2 does not show the wire bonds 109, that is only for ease of depiction, and that in FIG. 2 and the remainder of the figures in the detailed description, the LED chips 108-1 to 108-3 may include the wire bonds to electrically couple the LED chips 108-1 to 108-3 to corresponding leads 102-4 to 102-6.

The light collector 114 can be placed over the LED chips 108-1 to 108-3 and the encapsulation layer 106. The light collector can be formed from epoxy, silicone, or some other light-transmissive material. The light collector 114 can be coated with a reflective coating 112 on the top surface of the light collector 114 except for an uncoated aperture 110 at or near the apex, center, or top of the light collector 114. Light emitted by the LED chips 108-1 to 108-3 can enter the light collector 114, and reflect one or more times off the reflective coating 112, thereby mixing within the light collector before eventually exiting the light collector 114 via the aperture 110. The light mixing within the light collector 114 before exiting via the aperture 110 results in light from each of the LED chips 108-1, 108-02, and 108-3 appearing as if the light originated from a single emission point or area (the aperture 110) instead of from 3 separate and distinct locations, thereby improving the emission pattern and reducing color over angle shifts of the LED package 100. It is to be appreciated that when the present disclosure refers to a single emission point, this is not a point in a mathematical sense, but instead refers to a single emission source (e.g., an LED chip or the output of the plurality of LED chips from the aperture 110). In this sense, a point can be a term for a light source that is smaller than the LED package or system being described, and the size can depend on the overall system.

In an embodiment, the reflective coating 112 on the light collector 114 can be a metal or metal oxide that is deposited or layered on the light collector 114. For example, the reflective coating 112 could be metal cladding (e.g., silver, aluminum, etc.) in one embodiment, or be a $TiO_2$ surface deposition, paint or coating in another embodiment. In another embodiment, the reflective coating 112 could comprise diffuse reflectors from either texturing or particulates in a medium (e.g., pigments). Additionally, the reflective coating 112 could be a fill layer of epoxy or silicone that comprises reflectors such as $TiO_2$. The choice of material for the reflective coating can be based on the desired emission characteristics of the LED package, with more highly reflective materials being used when higher intensity light emissions are desired. In the embodiment shown in FIG. 2, the reflective coating 112 is depicted as a thin coating on the surface of the light collector 114, but in other embodiments, the reflecting coating 112 could be a thicker layer as described above.

Figure 3:
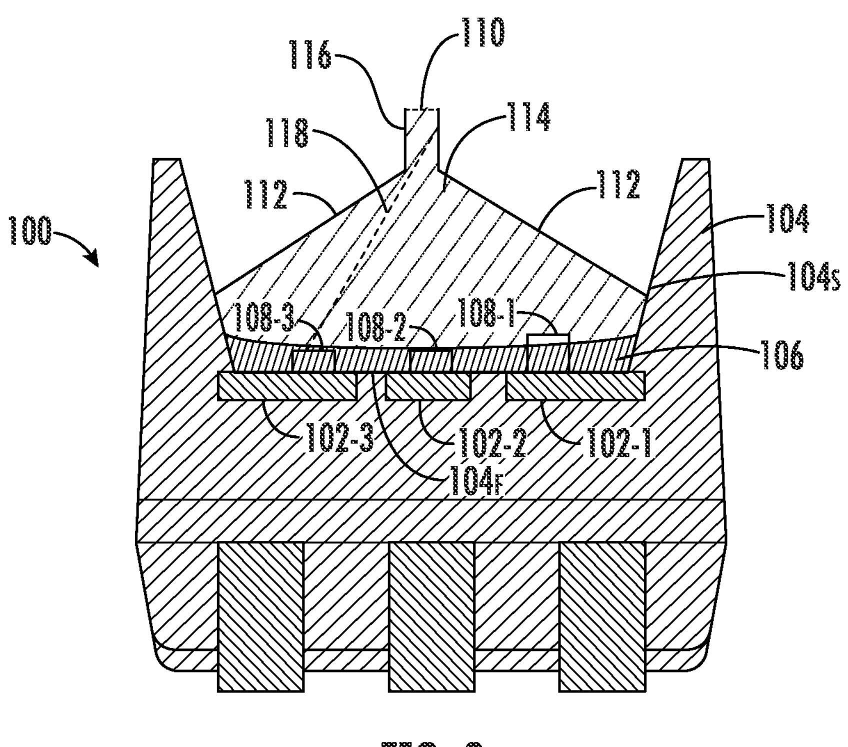
FIG. 3 is a cross-sectional view of an LED package with a different shaped light collector according to an embodiment of the present disclosure.

Turning now to FIG. 3, illustrated is a cross-sectional view of an LED package 100 with a different shaped light collector 114 according to an embodiment of the present disclosure. The light collector 114 in FIG. 3 has a stemmed portion 116 which can have a diameter roughly equivalent to the diameter of the aperture 110. The stemmed portion 116 can be in the shape of a cylinder that protrudes from a top, center, or apex of the light collector 114. In other embodiments, the stemmed portion 116 can have a shape other than being cylindrical. The height of the stemmed portion 116 can be such that there is no direct line of sight (exemplified by line 118) from LED chips 108-3 and 108-1 to the aperture 110, so that at least a portion of light emitted by LED chips 108-3 and 108-1 would have to reflect off one of the other surfaces such as the reflective coating 112, the recess floor 104$_F$, other LED chips, or sidewall at least one time before exiting the light collector 114 via the aperture 110. The height of the stemmed portion 116 can thus vary depending on both the diameter of the aperture 110 and/or the distribution or placement of the LED chips 108-1, 108-02, and 108-3 within the housing 104. For example, if the height of the stemmed portion were lowered, the width of the aperture 110 would decrease so that this condition of light reflecting at least one before exiting would be met. Alternatively, if the height of the stemmed portion increased, the aperture 110 could also widen, depending on the desired light emission characteristics. In an example, the width of the aperture 110 can be less than 10% a width of the housing 104 or a lens (See FIGS. 4-8 and 12) placed over the light collector 114. In an embodiment, the aperture can be greater than 50 μm. In an embodiment, a range of heights of the stemmed portion can range from no stemmed portion as depicted in FIG. 2, up to three times a height of the light collector base (e.g., a height of the light collector 114 without the stemmed portion) or three times the distance from a base of the stem to the recess floor 104F. In another embodiment, the stemmed portion can be greater than three times the height of the light collector 114. In an embodiment, the width of the columnar protrusion and the aperture is within 25% and 250% of a lateral dimension of one LED chip of the one or more of LED chips.

In an embodiment, the light collector 114 can be in various different shapes or configurations such as being comparatively flat or thin. The angle of its top surface could be reversed so as to be generally concave-shaped instead of convex shaped. In other embodiments, the light collector 114 could be omitted entirely, with a single aperture 110 former over the encapsulation 106.

In an embodiment, the top of the stem portion 116 may extend above the sidewalls $\mathbf{104}_S$ of the housing 104 as depicted in FIG. 3. In other embodiments, the top of the stem portion 116 may be at the same height as the tops of the sidewalls $\mathbf{104}_S$ or in other embodiments, lower than the tops of the sidewalls $\mathbf{104}_S$.

Figure 4:
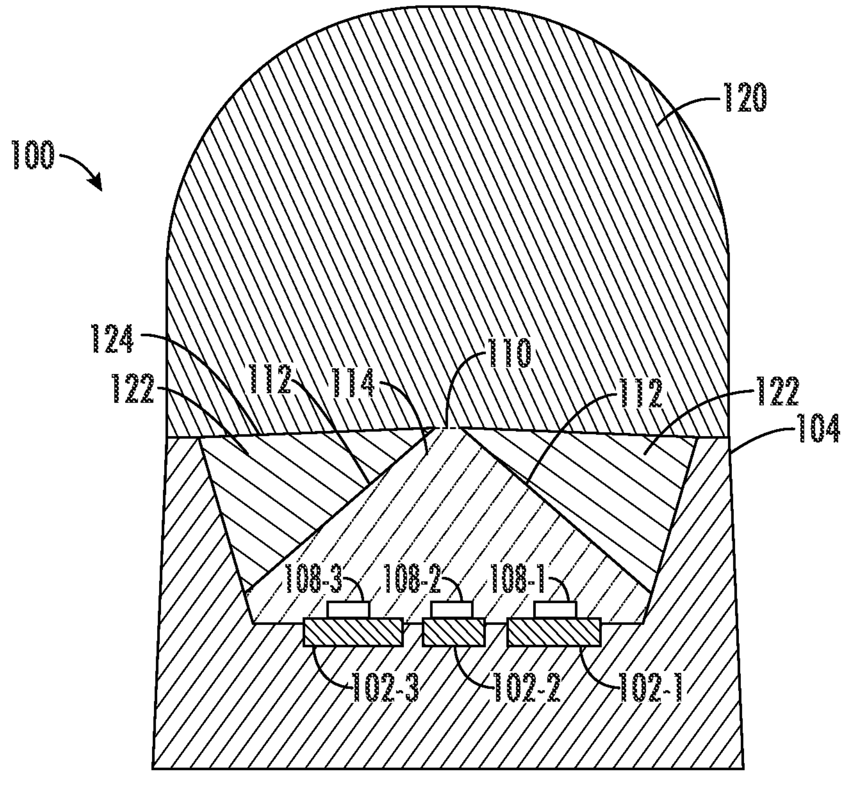
FIG. 4 is a cross-sectional view of an LED package with a light collector and lens according to an embodiment of the present disclosure.

FIG. 4 is a cross-sectional view of an LED package with a light collector and lens according to an embodiment of the present disclosure.

FIG. 4 is similar to the embodiment shown in FIG. 2 except for the addition of a fill material 122 around and over the light collector 114. The aperture 110 is not covered with the fill material 122. In various embodiments, the fill material 122 can include light-altering materials, such as light-reflective materials or light-absorptive materials that either entirely or partially reflect or block or reduce light that may pass through or around the reflective coating 112 the light collector, and can ensure that the majority of the light emitted by the LED package 100 is via the aperture 110. The fill material can be an epoxy or silicone that has a composition configured to be light-reflecting or blocking. In an embodiment, the fill material 122 can leave at least a portion of the light collector 114 around the aperture 110 uncovered.

A masking layer 124 can be deposited over the fill material 122. The masking layer 124 can improve contrast, and further improve the FFP of the LED package 100. The masking layer can be seen in more detail in FIG. 10. The masking layer 124 can be black or otherwise light-absorbing.

Another addition to FIG. 4 relative to the embodiment shown in FIG. 2 is the lens 120 that is placed over the light collector 114, fill material 122, and masking layer 124. In some embodiments, as shown in FIG. 4, the lens 120 may also be placed over at least a portion of the housing 104 as well.

The lens 120 can be a lens that is either formed over the rest of the LED package 100 using a molding process or is formed as a separate element and later fixed to the LED package 100 with an adhesive. The lens 120 can be glass or silicone or another suitable light-transmissive material.

It is also to be appreciated that while a top of the fill material 122 is shown in FIG. 4 as forming a straight line between the housing 104 and the aperture 110, the fill material 122 may sag in the middle and/or be higher at or near the edges near the housing 104 or light collector 114 due to surface adhesion and encapsulant swelling or shrinkage during the curing process. Other shapes are contemplated and may be determined by design and natural process characteristics.

Figure 5:
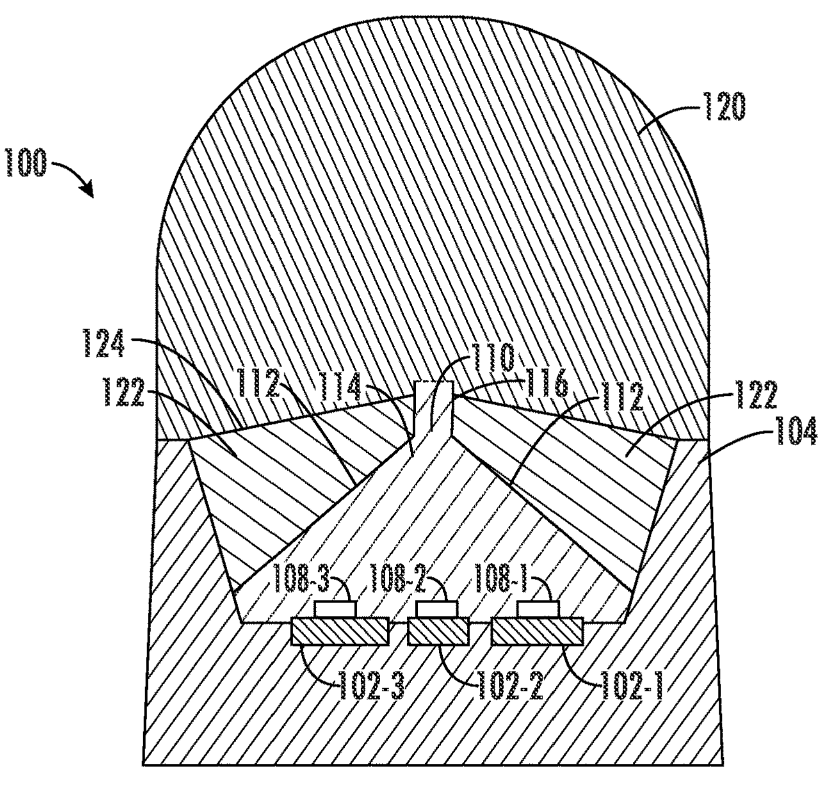
FIG. 5 is a cross-sectional view of an LED package similar to that shown in FIG. 4 with a different shaped light collector according to an embodiment of the present disclosure.

In the embodiment shown in FIG. 5, which is comparable to the embodiment of FIG. 3, except with the fill material 122, masking layer 124, and lens 120, the fill material 122 may also leave a portion of the stem portion 116 uncovered in some embodiments. In other embodiments, the fill material 122 may cover all of the stem portion 116. In the embodiment where the fill material 122 covers a portion of the stem portion 116, which is not shown in the figures, fill material 122 must be at least partially transmissive to light and if its transmissivity is low, the portion covering the stem portion 116 must be sufficiently thin to provide the expected light output efficiency. It is also to be appreciated that in FIG. 5, the stem portion 116 is taller than the walls of the housing 104, but in other embodiments, the top of the stem portion 116 may be at the same height as, or lower than, the walls of the housing 104.

Figure 6:
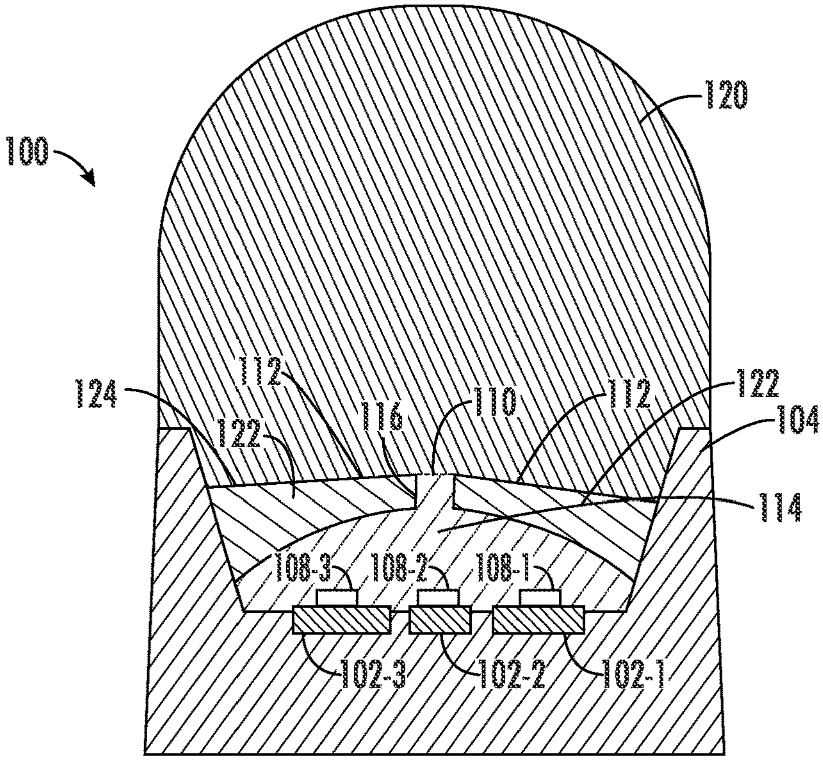
FIG. 6 is a cross-sectional view of an LED package similar to that shown in FIGS. 4 and 5 with a different shaped light collector according to an embodiment of the present disclosure.

FIG. 6 displays another example of an LED package 100 similar to those shown in FIGS. 4 and 5 except, with a light collector 114 that is differently shaped. The light collector 114 in FIG. 6 can form a dome shape with a curved top edge, while the light collectors in FIGS. 2-5 are conically shaped with straight top edges. The curved edge of the dome-shaped light collector 114 in FIG. 6 may provide better light extraction characteristics than the conical-shaped light collectors in FIGS. 2-5.

Figures 7, 8:
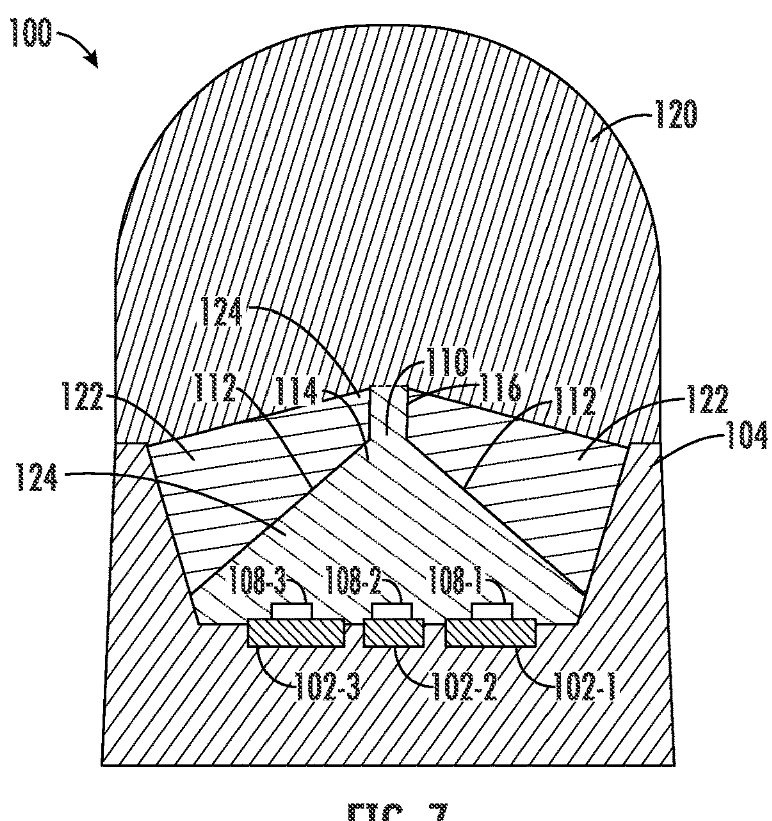
FIG. 7 is a cross-sectional view of an LED package similar to that shown in FIG. 5 with a light collector with diffuser material according to an embodiment of the present disclosure.
FIG. 8 is a cross-sectional view of an LED package similar to that shown in FIG. 6 with a light collector with diffuser material according to an embodiment of the present disclosure.

FIGS. 7 and 8 are cross-sectional views of an LED package 100 similar to that shown in FIGS. 5 and 6 except that the light collectors 114 in FIGS. 7 and 8 are formed with diffuser material within the light collector which can further facilitate the mixing of light within the light collectors 114. The diffuser material can be silica or $TiO_2$, or any other light scattering material according to an embodiment of the present disclosure.

Figure 9:
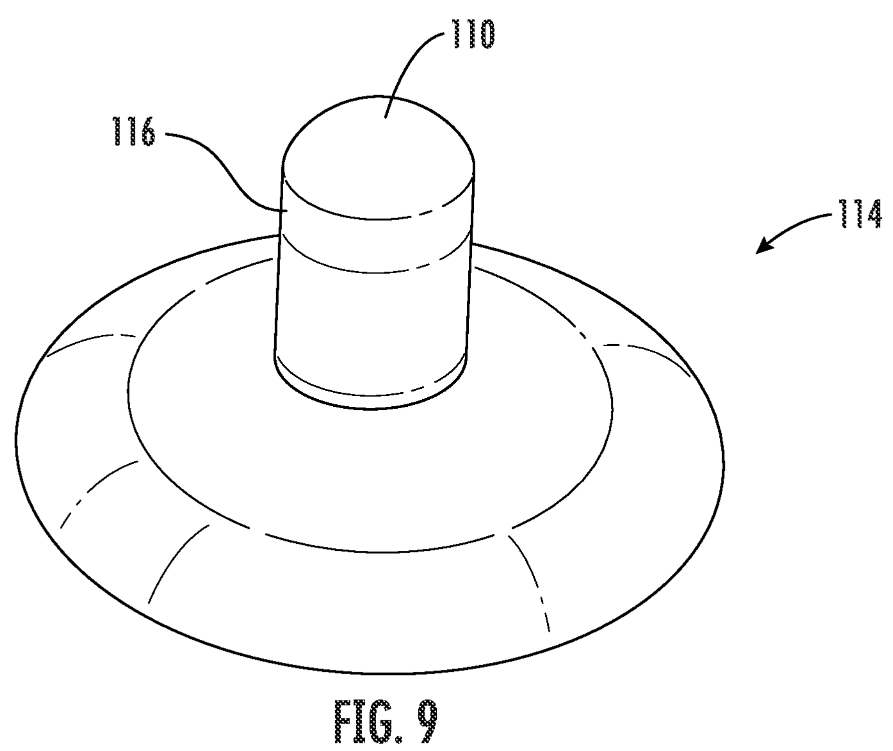
FIG. 9 is a view of a light collector according to an embodiment of the present disclosure.

FIG. 9 is a view of a light collector 114 according to an embodiment of the present disclosure. The view of the light collector 114 in FIG. 9 is the light collector 114 without the metallic or metal oxide reflective coating 112. The version of the light collector 114 depicted is the light collector 114 that has a stem portion 116. The light collector 114 may be formed by molding a plurality of light collectors with epoxy or silicone, and then the plurality of light collectors can be coated with a metal or metal oxide coating for the reflective coating 112. A masking layer 124 may also be added over 112 to provide a non-reflective or black layer and improve contrast as discussed previously. In an example embodiment, if a sufficiently thick aluminum layer is used for the reflective coating 112, it can subsequently be anodized with black pigment to provide the masking layer 124. The tops of the light collectors can then be polished or ground to remove the reflective coating 112 at the top of the stem portion 116 to create the aperture 110. The light collectors can then be separated from each other and placed over the LED chips 108 and encapsulant 106 in the recess 103.

Figure 10:
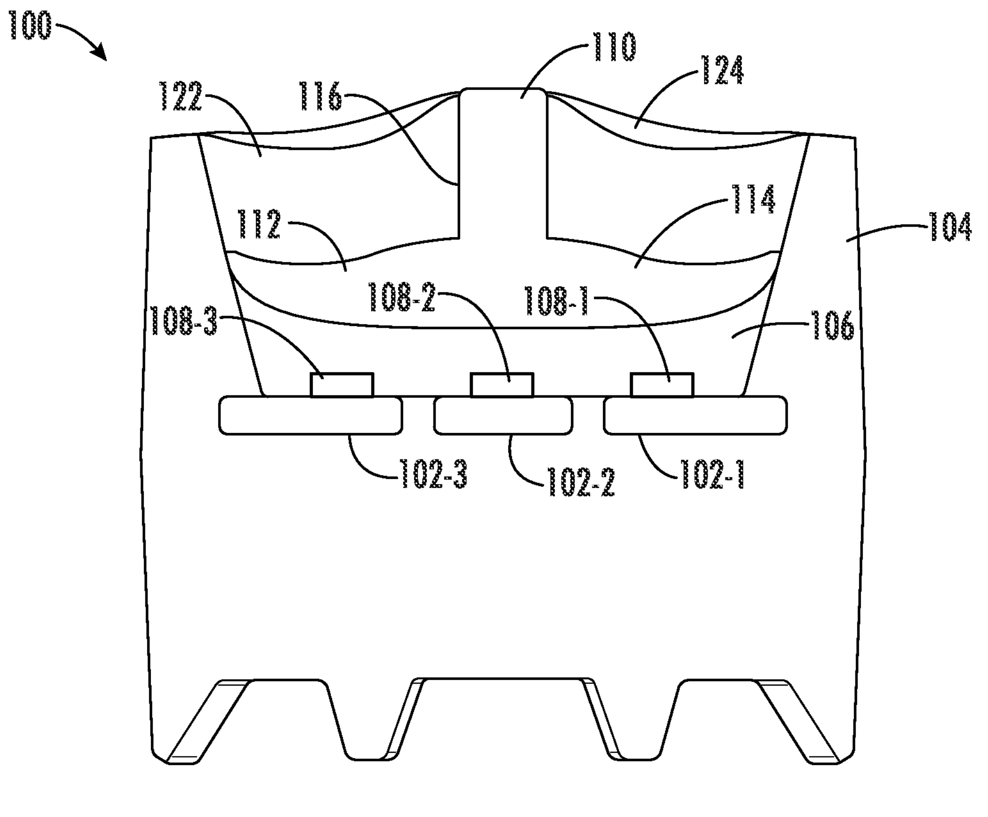
FIG. 10 is another cross-sectional view of an LED package with a light collector and fill material according to an embodiment of the present disclosure.

FIG. 10 is another cross-sectional view of an LED package with a light collector and fill material according to an embodiment of the present disclosure. FIG. 10 is a stylized cross-sectional view of an actual LED package 100. As can be seen in FIG. 10, the fill material 122 can have a meniscus shape due to surface adhesion with walls of the stem portion 116 and the housing 104, encapsulant shrinkage, or a designed process. The black masking layer 124 can also be seen covering the top of the fill material 122, but leaving the aperture 110 of the light collector 114 uncovered. The embodiment depicted here, also shows the encapsulant layer 106 surrounding and at least partially covering the LED chips 108-1, 108-2, and 108-3.

Figure 11:
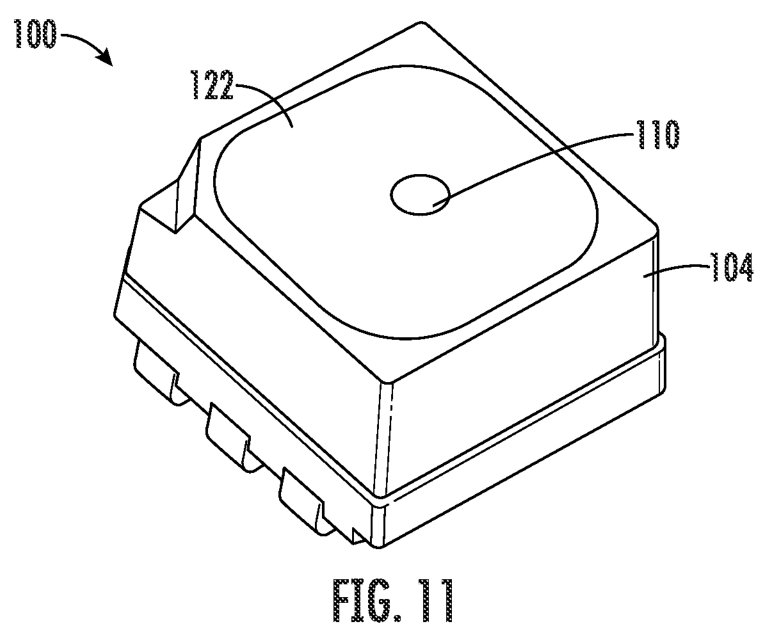
FIG. 11 is a perspective view of an LED package with a light collector and fill material according to an embodiment of the present disclosure.

FIG. 11 is a perspective view of an LED package 100 with a light collector 114 and fill material 122 according to an embodiment of the present disclosure. The LED package 100 depicted in FIG. 11 is before the masking layer 124 has been applied and before the lens 120 is molded or fixed thereto. The aperture 110 is visible in the middle of the LED package 100 surrounded by the fill material 122.

Figure 12:
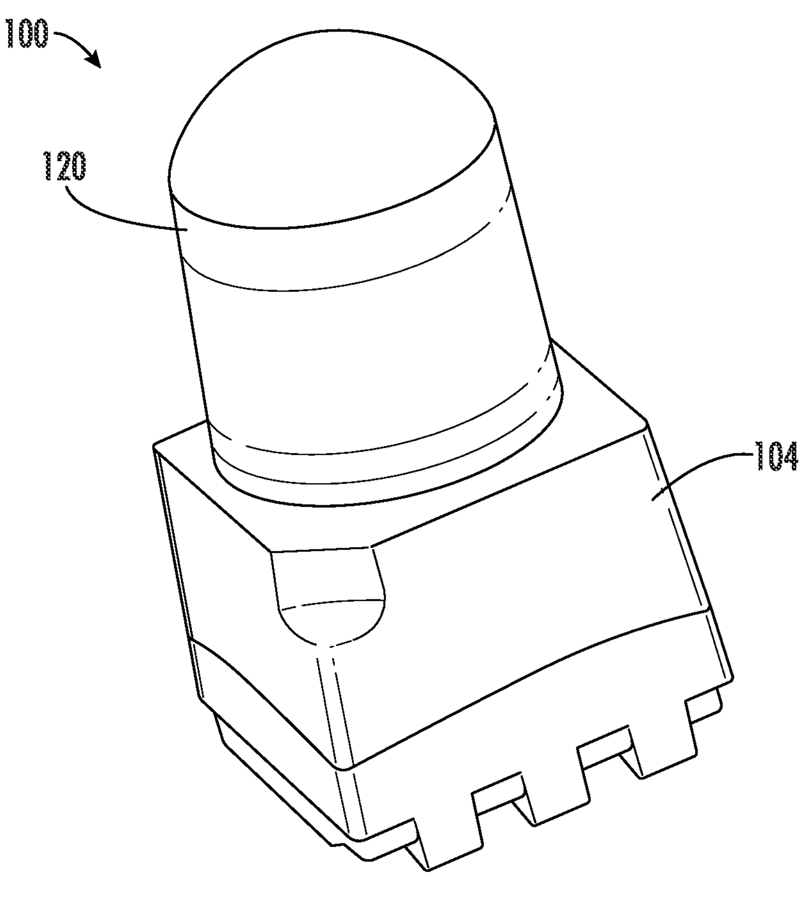
FIG. 12 is a perspective view of an LED package with a lens according to an embodiment of the present disclosure.

FIG. 12 is a perspective view of an LED package 100 with a lens 120 according to an embodiment of the present disclosure. The lens 120 is placed over the top of the fill material 122 and masking layer 124, and in some embodiments, at least over a portion of the housing as well. The lens 120 can further improve the FFP of the light emitted by the LED package.

Figure 13:
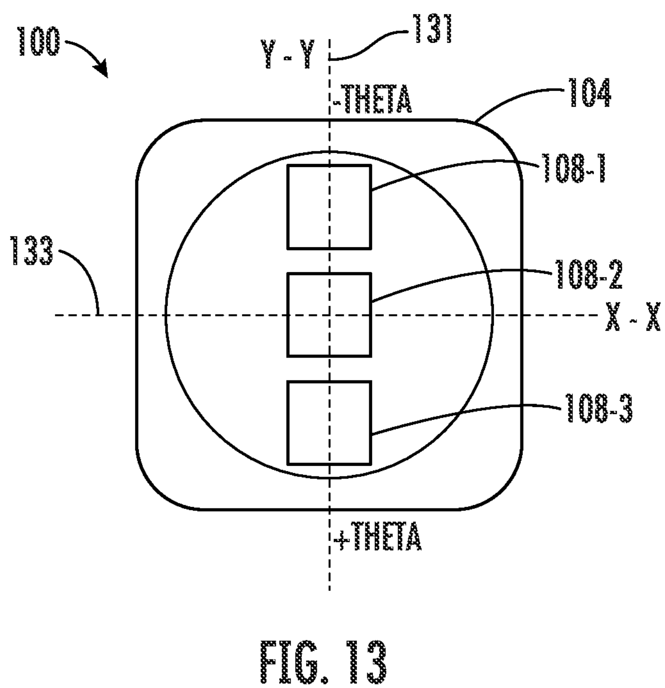
FIG. 13 depicts a representation of an LED package with axes on which light intensity as a function of viewing angle is plotted in the Far Field Pattern (FFP) graphs of FIGS. 14A-14B and 15A-15B.

FIG. 13 depicts a representation of an LED package with axes on which light intensity as a function of viewing angle is plotted in the FFP graphs of FIGS. 14A-14B and 15A-15B. For example, an FFP graph can be plotted for light intensity with respect to a viewing angle along Y-Y axis 131 or along X-X axis 133, with light intensities corresponding to chips 108-1, 108-2, and 108-3.

Figure 14A:
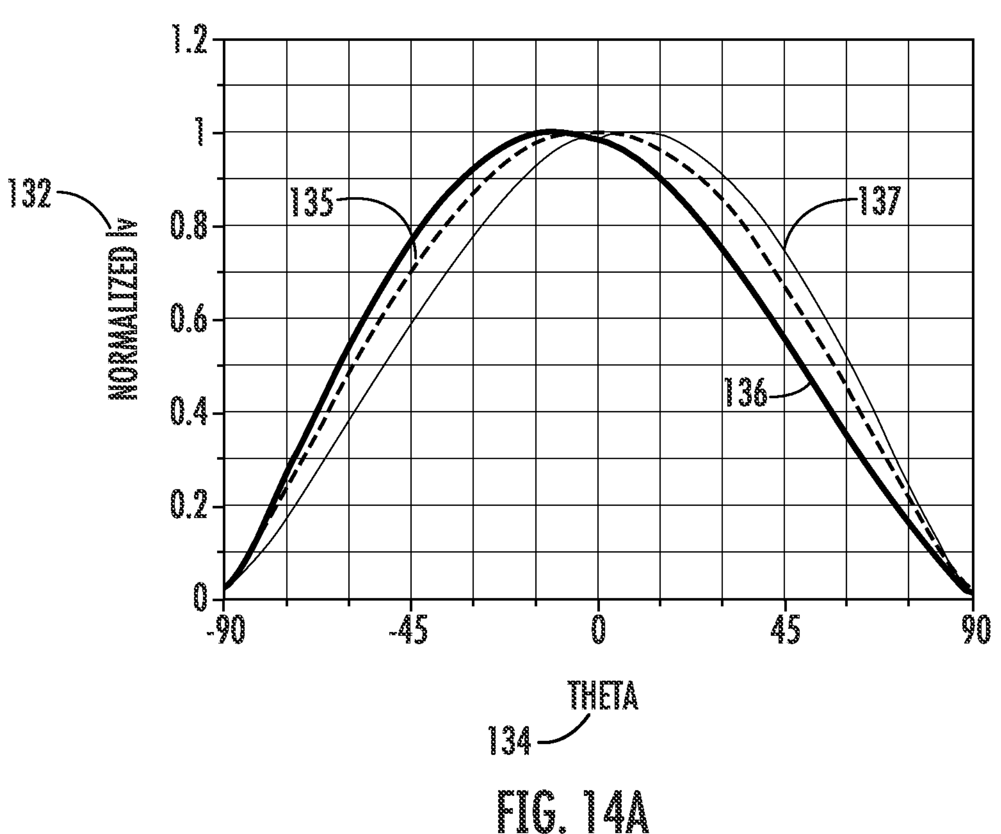
FIGS. 14A and 14B depict graphs of FFPs of a conventional LED package.
Figure 14B:
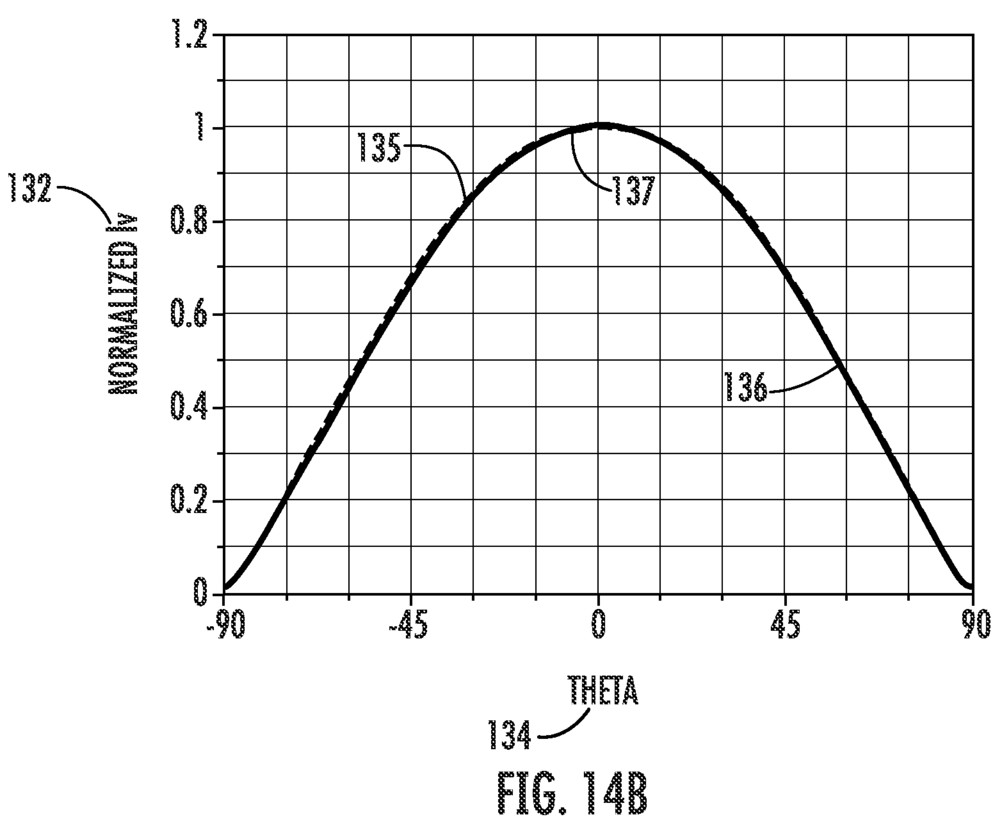

FIGS. 14A and 14B depict graphs of FFPs of a conventional LED package. The conventional LED package is an LED package similar to FIG. 11 but without the light collector 114 or lens 120 as used in the present disclosure. FIG. 14A depicts the FFP along the Y-Y axis 131, of light intensity 132 at different+/−theta values 134 which are plotted in degrees, where theta=0 is directly above or opposite the LED package. In the embodiment depicted in FIGS. 14A and 14B, the plot line 137 corresponds to light from LED chip 108-1, line 135 corresponds to light from LED chip 108-2, and line 136 corresponds to light from LED chip 108-3. In FIG. 14A, the peak intensity of LED chip 108-2 is at theta 0, whereas the maximum delta-theta for LED chips 108-1 and 108-3 relative to the central peak of chip 108-2 is between 10-15 degrees, which corresponds to a peak intensity for those chips at a 10-15 degree viewing angle relative to straight above or opposite the LED package. The plot lines 135, 136, and 137 are nearly identical along the X-X axis 133 shown in FIG. 14B, since the chips are arranged in the housing 104 of the LED package in a line perpendicular to X-X axis 133. In this regard, the color uniformity along the X-X direction is generally considered to be excellent and meets requirements for most display systems.

Figure 15A:
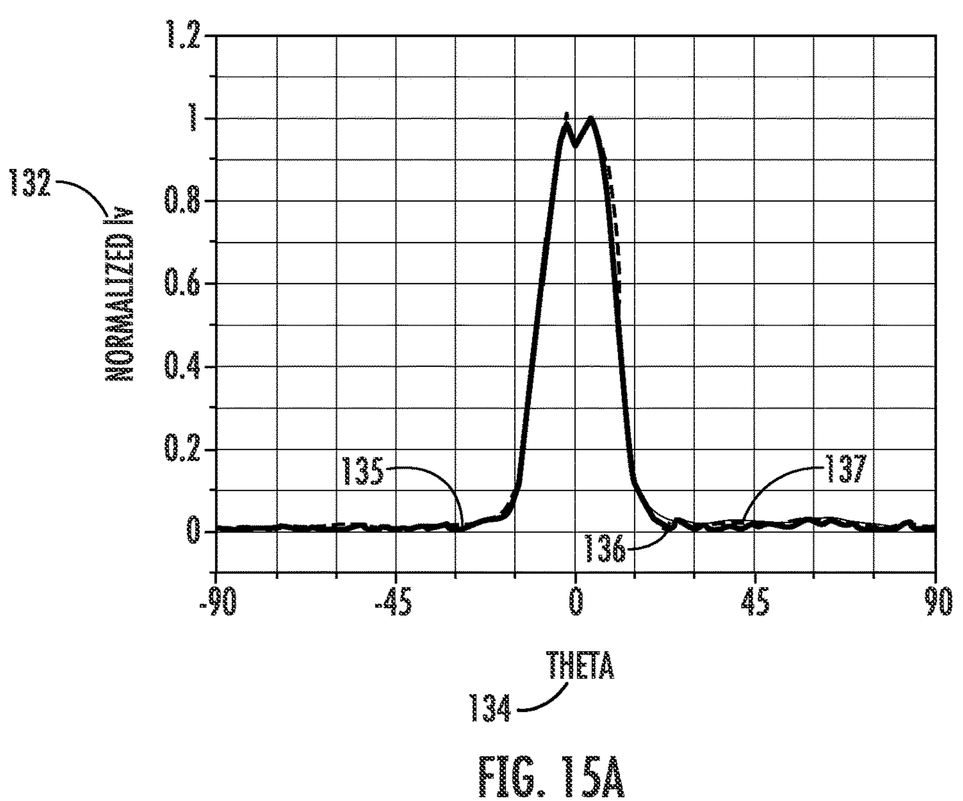
FIGS. 15A and 15B depict graphs of FFPs of the LED package disclosed herein according to an embodiment of the present disclosure.
Figure 15B:
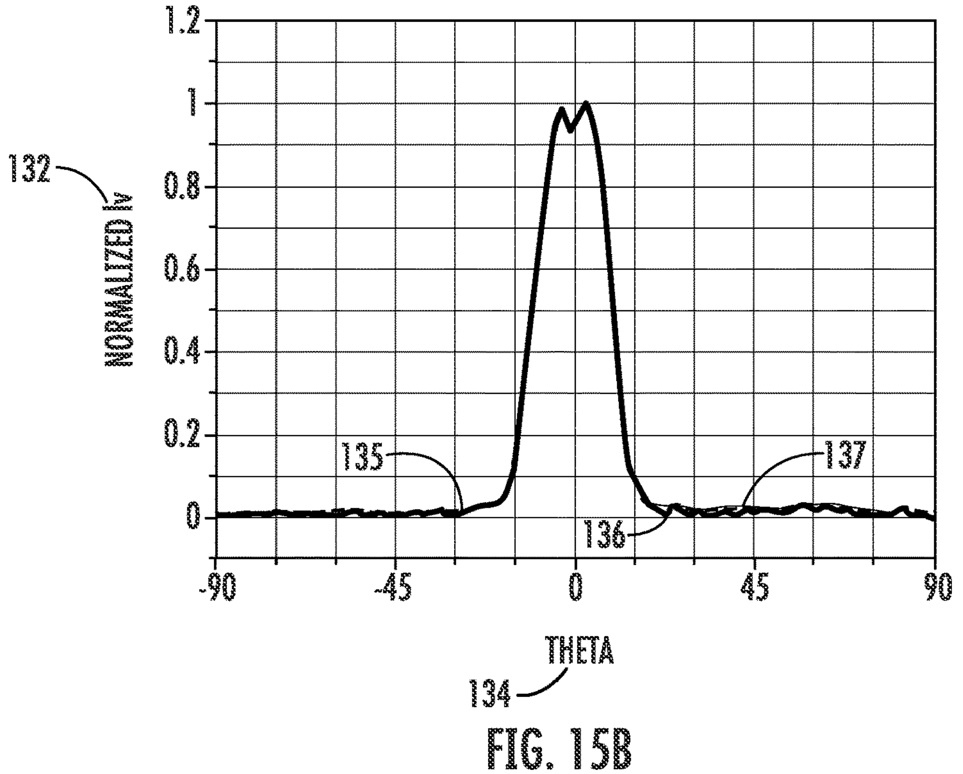

FIGS. 15A and 15B depict graphs of Far Field Patterns of LED package 100 from FIG. 12 according to embodiments of the present disclosure. FIG. 15A depicts the FFP along the Y-Y axis 131, of light intensity 132 at different+/−theta values 134, where theta=0 is directly above or opposite the LED package 100. In FIGS. 15A and 15B, the plot line 137 corresponds to light from LED chip 108-1, line 135 corresponds to light from LED chip 108-2, and line 136 corresponds to light from LED chip 108-3. In FIG. 15A, the peak intensity of all of the LED chips 108-1, 108-2 and 108-3 are near theta=0 and the differences between the normalized intensities along the Y-Y axis 131 is near zero corresponding to excellent color uniformity across all Y-Y viewing angles and delta theta values of near zero. The color uniformity along the X-X axis 133 shown in FIG. 15B is also excellent and near zero, with delta theta values of near zero. FIGS. 15A and 15B clearly show the improvement in delta-theta between the LED package disclosed herein with the light collector relative to the conventional LED package that does not have the light collector, particularly when comparing the color uniformity along the Y-Y directions of FIGS. 14A and 15A.

Figures 16A, 16B:
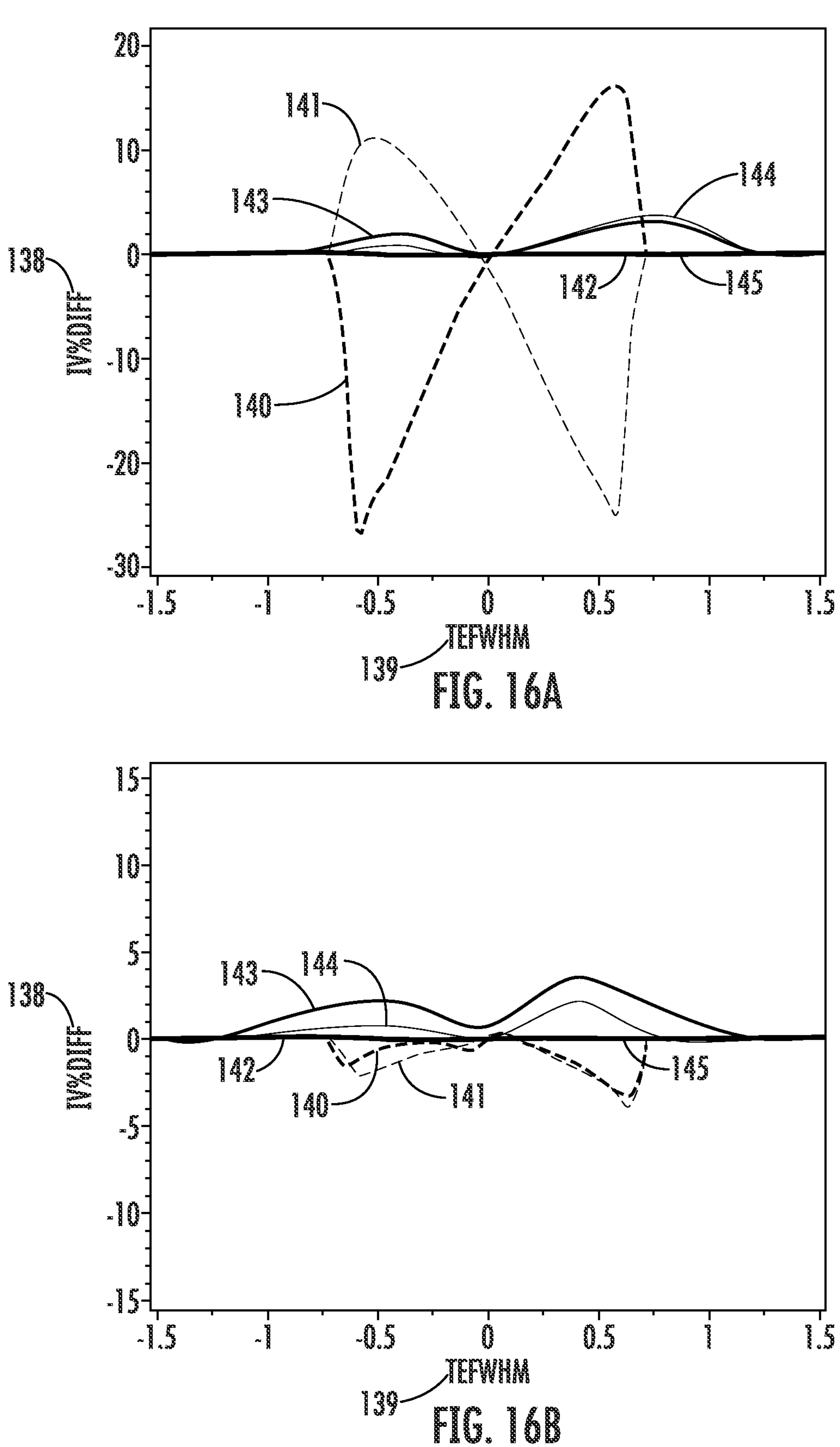
FIGS. 16A and 16B depict another representation of FFPs of the LED package disclosed herein compared to a conventional LED package according to an embodiment of the present disclosure.

FIGS. 16A and 16B depict another representation of FFPs of the LED package disclosed herein compared to a conventional LED package without a lens or a collector according to an embodiment of the present disclosure. In FIG. 16A, the axes are represented by Total Envelope Full Width Half Max (TEFWHM) on the x-axis 139 and by the intensity values % difference (IV % DIFF) on the y-axis 138, and the lines 140, 141, and 142 represent the red, blue and green colors emitted by a conventional LED package that does not include a light collector or a lens along the Y-Y axis 131. Lines 143, 144, and 145 represent the red, blue and green colors emitted by a LED package with a light collector and a lens along the Y-Y axis. The lines 140-142 are defined herein as intensity values % difference relative to the theta=0 trace 135 chip 108-2 as depicted in FIG. 14A. Lines 143-145 are defined herein as intensity values % difference relative to the theta=0 trace 135 chip 108-2 as depicted in FIG. 15A. Accordingly, line 142 and 145, which correspond to the green light emitted by chip 108-2, are flat lines with an IV % DIFF=0 over the range TEFWHM.

The TEFWHM corrects for component view angle to provide the envelope where the intensity of each color is above 50% at a given theta. The IV % DIFF is the difference relative to the central FFP line at theta=0 (which in a sample embodiment is the central green LED chip). The reference curve for the IV % DIFF is based on the chip that is the most centered anchor FFP, which in the embodiments disclosed herein, is LED chip 108-2, which is in this case is green. So, for example, the IV % Diff relative to Green (G) for Red (R) is given by the following equation:

$$RIv\ \%\ Diff = \left(\frac{RIv - GIv}{GIv}\right) * 100$$

Plotting the IV % Diff for each of Red and Blue more clearly shows the theta offsets and RGB full peak overlaps and provides for a better direct comparison of components with differing view angles.

FIG. 16B is a similar graph with the same lines except as viewed along the X-X axis 133.

Figure 17A:
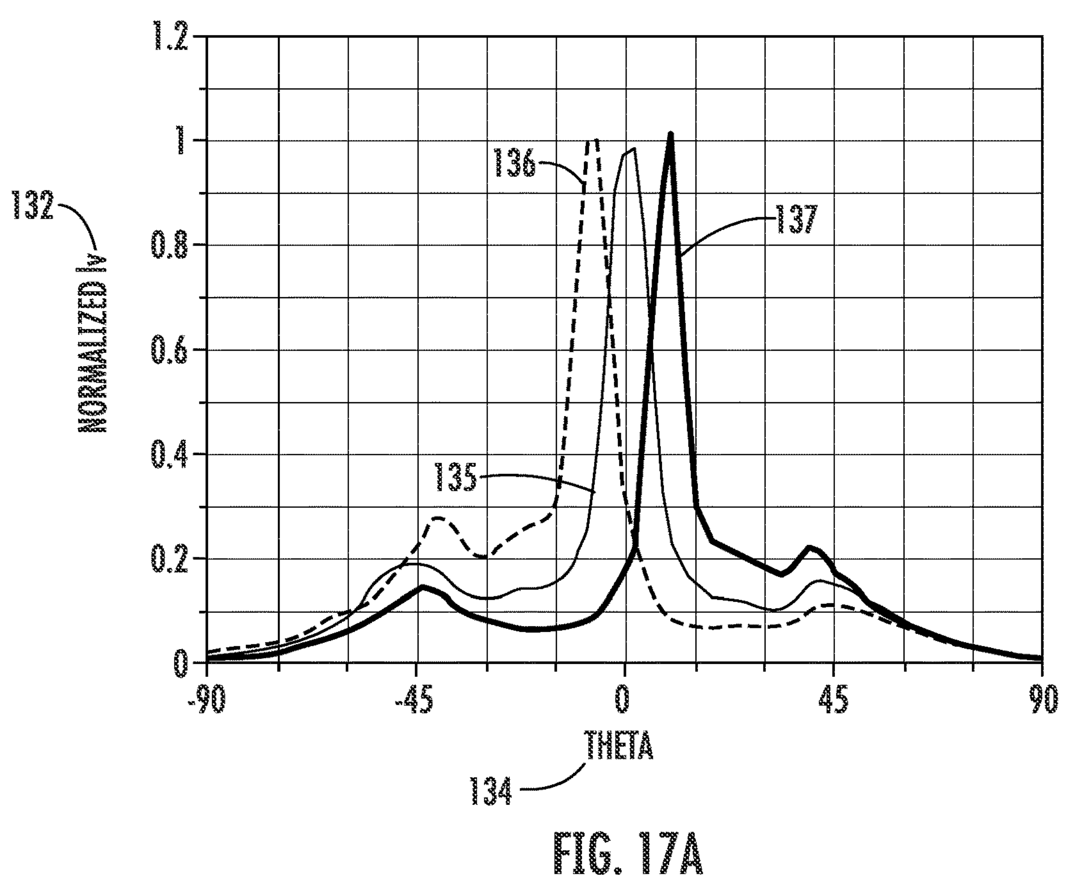
FIGS. 17A and 17B depict a representation of FFPs of an LED package that is lensed but does not include a collector.
Figure 17B:
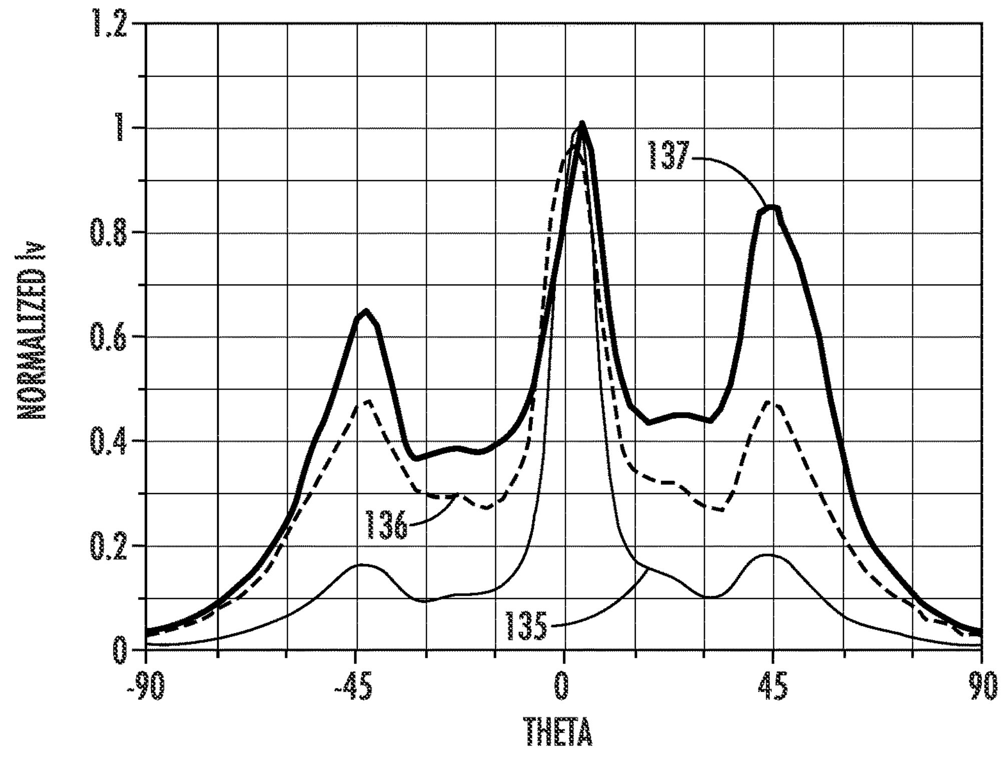

FIGS. 17A and 17B depict graphs of FFPs of an LED package that is lensed, but does not include a light collector. FIG. 17A depicts the FFP along the Y-Y axis 131, of light intensity 132 at different+/−theta values 134 which are plotted in degrees, where theta=0 is directly above or opposite the LED package. In the embodiment depicted in FIGS. 17A and 17B, the plot line 137 corresponds to light from LED chip 108-1, line 135 corresponds to light from LED chip 108-2, and line 136 corresponds to light from LED chip 108-3.

Figure 18A:
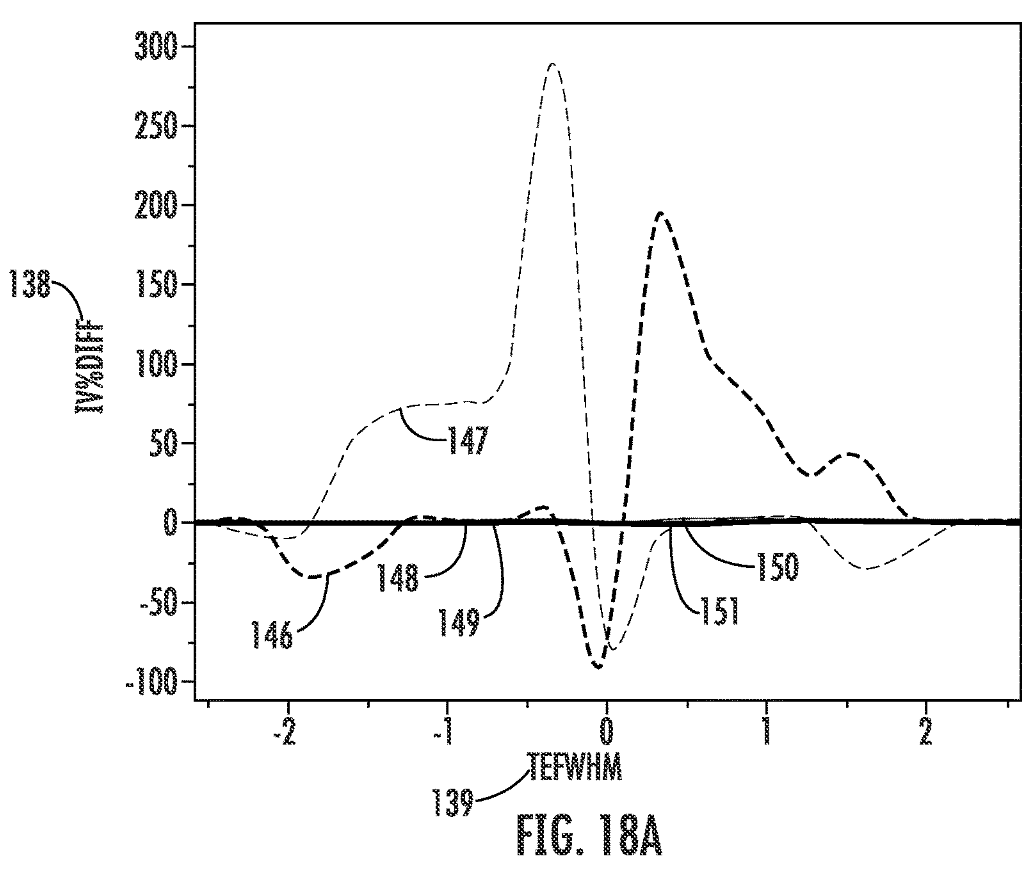
FIGS. 18A and 18B depict another representation of FFPs of the lensed LED package disclosed herein compared to a lensed RGB component that does not have a collector according to an embodiment of the present disclosure.
Figure 18B:
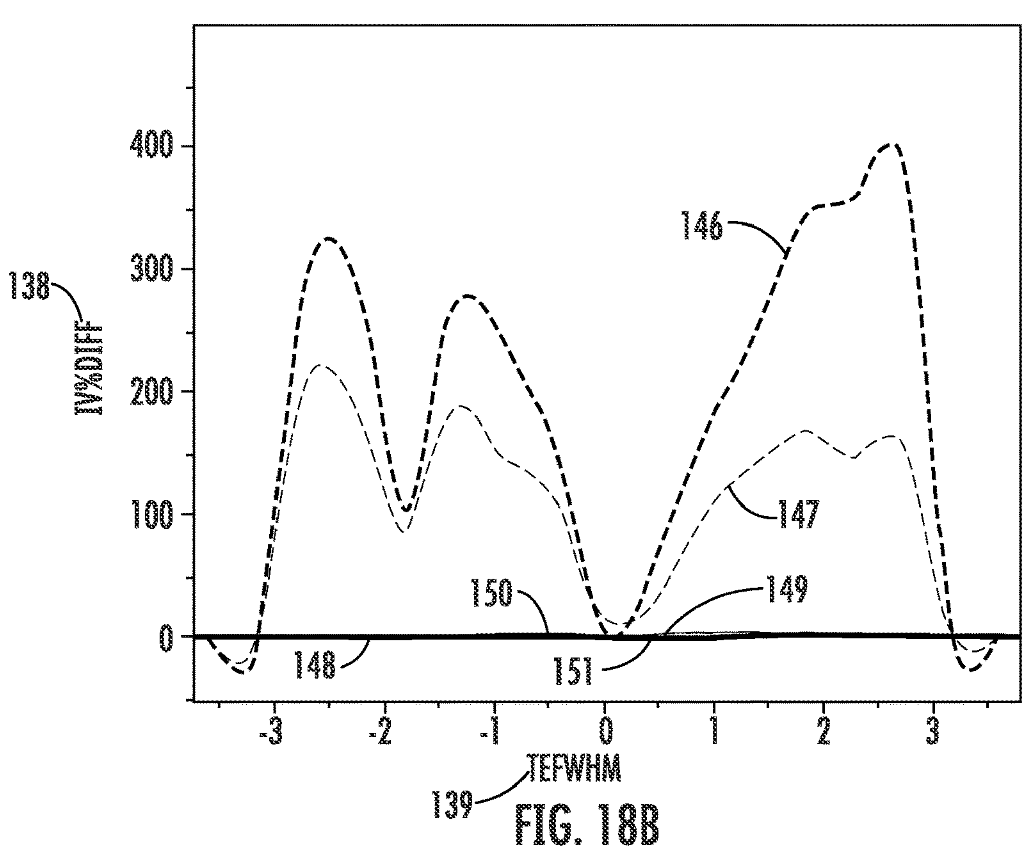

FIGS. 18A and 18B depict another representation of FFPs of the lensed LED package disclosed herein compared to a lensed LED package without a collector according to an embodiment of the present disclosure. In FIGS. 18A and 18B are plotted the lines 146, 147, and 148 for red, blue and green light emitted by an LED package that is lensed, but does not include a light collector, while lines 149, 150, and 151 are for red, blue, and green light emitted by an LED package that includes both a light collector and lens. It is to be appreciated that lines 149, 150, and 151 correspond to lines 143, 144, and 145 in FIGS. 16A and 16B above. The plots in FIG. 18A are along the Y-Y axis 131, and in FIG. 18B along the X-X axis 133.

Figure 19:
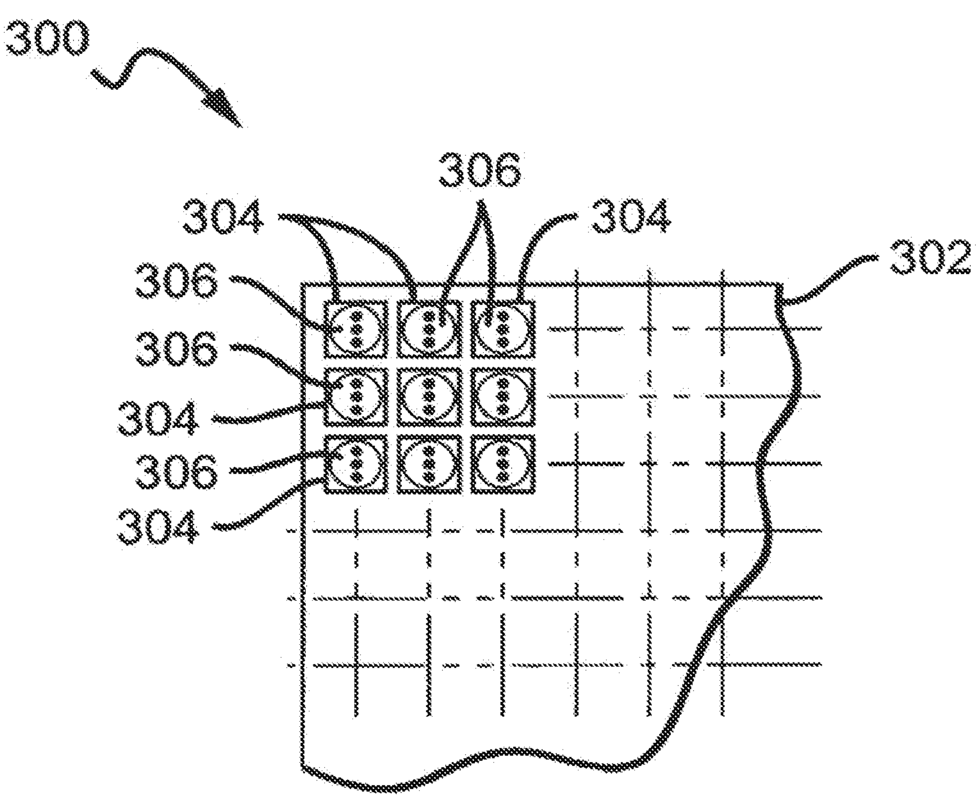
FIG. 19 is a top view of a front face of a representative display screen according to an embodiment of the present disclosure.

With reference to FIG. 19, there is shown in schematic form a portion of an LED display screen 300, for example, an indoor and/or outdoor screen comprising, in general terms, a driver printed circuit board (PCB) 302 carrying a large number of surface-mount devices (SMD) 304 arranged in rows and columns, each SMD defining a pixel. The SMDs 304 may comprise devices such as the embodiments shown in FIGS. 1-8, and 10-12. The SMD devices 304 are electrically connected to traces or pads on the PCB 302 connected to respond to appropriate electrical signal processing and driver circuitry (not shown). As disclosed above, it is to be appreciated that while FIG. 19 depicts the LED chips 306 being arranged in a line, in other embodiments, the LED chips 306 can be arranged in different configurations.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:

one or more LED chips;

at least one light collector arranged over the one or more LED chips, wherein the light collector is formed from a first light-transmissive material; and at least one reflective coating on a surface of the light collector wherein the reflective coating forms at least one aperture, wherein the aperture of the light collector is at a top of a stem portion of the light collector that protrudes from a remainder of the light collector, wherein a width of a base of the stem portion is between 25% and 250% of a lateral dimension of one LED chip of the one or more LED chips.

2. The LED package of claim 1, wherein a first width of the stem portion and the aperture is less than 10% of a second width of a housing.

3. The LED package of claim 1, wherein a width of the aperture is at least 50 μm.

4. The LED package of claim 1, wherein a height of the stem portion is such that at least a portion of light emitted by at least one LED chip of the one or more LED chips reflects off at least one surface at least one time before exiting the aperture.

5. The LED package of claim 1, wherein there is not a direct line of sight between the aperture and a significant portion of at least one LED chip of the one or more LED chips.

6. The LED package of claim 1, wherein a lens with a curved surface is fixed at least partially over the light collector.

7. The LED package of claim 1, further comprising a fill layer surrounding the light collector that blocks stray light from the light collector.

8. The LED package of claim 7, further comprising a masking layer on the fill layer.

9. The LED package of claim 1, wherein the light collector comprises diffuser material that diffuses light emitted by the one or more LED chips.

10. The LED package of claim 1, wherein a top surface of the light collector is at least one of curved or straight, and wherein the stem portion is at an apex of the light collector.

11. The LED package of claim 1, wherein the reflective coating comprises at least one of a metal or metal oxide.

12. The LED package of claim 1, wherein respective far field patterns of light emitted by each LED chip of a plurality of chips have a maximum delta-theta of less than 2 degrees.

13. The LED package of claim 1, wherein the first light-transmissive material is epoxy or silicone.

14. The LED package of claim 1, further comprising:

a housing that forms a recess with a recess floor and one or more recess sidewalls, wherein the one or more LED chips are arranged in the recess; and a lead frame structure extending through the housing, wherein a portion of the lead frame structure is arranged along the recess floor.

15. A light-emitting diode (LED) package comprising:

one or more LED chips; and at least one light collector arranged at least partially over the one or more LED chips, wherein the light collector comprises a columnar protrusion and wherein the light collector is formed from a first light-transmissive material, wherein a base of the columnar protrusion is between 25% and 250% of a lateral dimension of one LED chip of the one or more LED chips.

16. The LED package of claim 15, wherein there is not a direct line of sight between at least 50% of the top surface of one LED chip of the one or more LED chips and an aperture of the light collector.

17. The LED package of claim 15, wherein the light collector comprises diffuser material that diffuses light emitted by the one or more LED chips.

18. The LED package of claim 15, wherein respective far field patterns of light emitted by each LED chip of a plurality of chips have a maximum delta-theta of less than 2 degrees.

19. The LED package of claim 15, further comprising:

a housing that forms a recess with a recess floor and one or more recess sidewalls; and a lead frame structure extending through the housing, wherein a portion of the lead frame structure is arranged along the recess floor.

20. The LED package of claim 15, further comprising:

a reflective coating covering an entire outer surface of the light collector except for a reduced aperture at a top of the columnar protrusion.

21. The LED package of claim 20, further comprising:

a lens at least partially over the light collector.

22. A light-emitting diode (LED) package comprising:

a housing that forms a recess with a recess floor and one or more recess sidewalls;

a lead frame structure extending through the housing, wherein a portion of the lead frame structure is arranged along the recess floor;

one or more LED chips arranged within the recess and electrically coupled with the lead frame structure;

a light collector arranged at least partially within the recess and over the one or more LED chips, wherein the light collector is formed from a first light-transmissive material;

a reflective coating on a surface of the light collector wherein the reflective coating forms an aperture at an apex of the light collector, wherein the aperture of the light collector is at a top of a stem portion of the light collector that protrudes from a remainder of the light collector, wherein a width of a base of the stem portion is between 25% and 250% of a lateral dimension of one LED chip of the one or more LED chips; and a lens with a curved surface is fixed over at least part of the light collector.

23. A light-emitting diode (LED) display comprising:

a display panel; and at least one LED package comprising:

one or more LED chips;

at least one light collector arranged over the one or more LED chips, wherein the light collector is formed from a first light-transmissive material; and at least one reflective coating on a surface of the light collector wherein the reflective coating forms at least one aperture, wherein the aperture of the light collector is at a top of a stem portion of the light collector that protrudes from a remainder of the light collector, wherein a width of a base of the stem portion is between 25% and 250% of a lateral dimension of one LED chip of the one or more LED chips.

24. The LED display of claim 23, wherein a lens with a curved surface is fixed over at least part of the light collector.

25. The LED display of claim 23, wherein respective far field patterns of light emitted by each LED chip of a plurality of chips have a maximum delta-theta of less than 2 degrees.

26. The LED display of claim 23, wherein the one or more LED chips is a plurality of LED chips that are comprised of a combination of red, green, and blue LED chips.

* * * * *